United States Patent
Gardner et al.

(10) Patent No.: US 7,251,150 B2
(45) Date of Patent: Jul. 31, 2007

(54) RADIATION-HARDENED PROGRAMMABLE DEVICE

(75) Inventors: Harry N. Gardner, Colorado Springs, CO (US); David Kerwin, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 147 days.

(21) Appl. No.: 11/132,799

(22) Filed: May 19, 2005

(65) Prior Publication Data

US 2005/0219891 A1  Oct. 6, 2005

Related U.S. Application Data

(63) Continuation-in-part of application No. 10/045,571, filed on Oct. 23, 2001, now Pat. No. 6,917,533.

(51) Int. Cl.
G11C 17/00 (2006.01)

(52) U.S. Cl. .......................... 365/94; 365/154; 365/104

(58) Field of Classification Search .................. 365/94, 365/154, 104, 185.07, 185.14, 185.27
See application file for complete search history.

(56) References Cited

U.S. PATENT DOCUMENTS

| | | |
|---|---|---|
| 4,379,259 A | 4/1983 | Varadi et al. |
| 4,939,694 A | 7/1990 | Eaton et al. |
| 5,007,026 A | 4/1991 | Gaultier et al. |
| 6,041,008 A * | 3/2000 | Marr ........................ 365/225.7 |
| 6,388,911 B1 | 5/2002 | Lee |
| 6,724,671 B2 * | 4/2004 | Yumoto ....................... 365/201 |
| 6,768,669 B2 * | 7/2004 | Schmidt et al. ............. 365/154 |
| 6,807,081 B2 * | 10/2004 | Nii .............................. 365/145 |
| 7,120,818 B2 * | 10/2006 | Dietrich et al. ............. 713/600 |
| 2005/0127419 A1 * | 6/2005 | Hashimoto ................... 257/296 |
| 2005/0237840 A1 * | 10/2005 | Diorio et al. ............. 365/225.7 |

FOREIGN PATENT DOCUMENTS

JP  08255843 A  10/1996

* cited by examiner

*Primary Examiner*—Van Thu Nguyen
*Assistant Examiner*—Dang Nguyen
(74) *Attorney, Agent, or Firm*—Peter J. Meza; William J. Kubida; Hogan & Hartson LLP

(57) ABSTRACT

A method of programming a radiation-hardened integrated circuit includes the steps of supplying a prototype device including an SRAM memory circuit or programmable key circuit to a customer, having the customer develop working data patterns in the field in the same manner as a reading and writing to a normal RAM memory, having the customer save the final debugged data pattern, delivering the data pattern to the factory, loading the customer-developed data pattern into memory, programming the customer-developed data pattern into a number of production circuits, irradiating the production circuits at a total dosage of between 300K and 1 Meg RAD to burn the data pattern into memory, and shipping the irradiated and programmed parts to the customer.

12 Claims, 7 Drawing Sheets

40

RADIATION-HARDENED PROGRAMMABLE DEVICE

RELATED APPLICATION

The present application is a divisional of U.S. patent application Ser. No. 10/045,571 filed Oct. 23, 2001 now U.S. Pat. No. 6,917,533 incorporated herein by reference in its entirety, which is assigned to the assignee of the present application.

BACKGROUND OF THE INVENTION

This invention relates generally to radiation-hardened integrated memory circuits or embedded memory circuits, and, more particularly, to a novel technique for permanently programming a pattern into the memory.

Radiation is absorbed in materials by two main mechanisms. The primary mechanism is by ionization in which electron-hole pairs are created. If the energy of the radiation is greater than the energy required to create an electron-hole pair, ionization can occur. The energy required to form an electron-hole pair in silicon is 3.6 eV. For each RAD in silicon, approximately 4.0E13 electron-hole pairs are formed per cubic centimeter. The energy required to form an electron-hole pair in silicon dioxide is 17 eV. Because of the difference in ionization energy, approximately 4.7-times more pairs are formed in silicon than in silicon dioxide for a given dose.

The secondary mechanism is by damage to the lattice structure of the material. Typically, lattice damage occurs due to radiation in the form of high energy neutrons, protons and heavy ions. The particle must have enough energy to break multiple bonds and to move the lattice atom away from its original site.

The interaction of ionizing radiation with materials is fairly complex. But a basic understanding of the effect of the "total dose" radiation on MOS electronics can be gained by examining ionization effects, i.e. the generation of electron-hole pairs the gate and field oxides of an MOS transistor.

Ionizing events occur when electrons in the semiconductor's valence band are raised to the conduction band. A fraction of the electron-hole pairs will undergo geminate (or initial) recombination and cause no damage. Geminate recombination decreases as the electric field increases, and the electrons and holes that survive it are free to diffuse and drift within the oxide where they will be swept from the insulator, recombine, or be trapped.

The trapped charge, particularly the trapped holes, causes much of the degradation of device parameters by radiation exposure. In device-quality silicon dioxide, the electrons move freely out of the oxide whereas the holes are more likely to become trapped. The trapped holes generate space-charge fields in the underlying silicon substrate, resulting in negative shifts in the threshold voltage.

As the threshold voltage shifts negatively, an N-channel transistor biased in the off-state lets more and more current pass. If enough holes are trapped, the N-channel transistor will remain fully conducting even with zero applied gate bias, transforming an enhancement-mode device into a depletion-mode device.

A cross-section of an MOS transistor is shown in FIGS. 1-4. FIG. 1 shows the transistor before a radiation burst. The transistor includes a silicon substrate 10, N-type source/drain regions 12, an oxide gate region 14A, and a polysilicon gate 16. In FIG. 2 numerous electron-hole pairs generated in the silicon dioxide gate 14B are shown immediately after a radiation burst. In FIG. 3 the holes remaining in the silicon dioxide gate 14C are shown after electron transport. In FIG. 4 the remaining trapped final charge is shown in silicon dioxide gate 14D.

While the generation of trapped holes in an N-channel transistor due to total dose radiation is normally an undesirable effect that must be overcome in radiation hardened circuits, what is desired is a technique for programming an integrated circuit having a memory or embedded memory portion that uses the effect of ionizing radiation to full advantage.

SUMMARY OF THE INVENTION

According to the present invention, a method of programming a radiation-hardened integrated circuit includes the steps of supplying a prototype device to a customer, having the customer develop working data patterns in the field in the same manner as a reading and writing to a normal RAM memory, having the customer save the final debugged data pattern, delivering the data pattern to the factory, loading the customer-developed data pattern into memory, programming the customer-developed data pattern into a number of production circuits, irradiating the production circuits at a total typical dosage of between 300K and 1 Meg RAD to burn the data pattern into memory, and shipping the irradiated and programmed parts to the customer.

A second embodiment of the invention uses a programmed key including a coupled N-channel transistor and resistor, or N-channel and P-channel transistor, both coupled between the VDD power supply and ground. In an integrated circuit, several programmed keys are provided. During radiation, the input node of each of the keys is set high or low and VDD is set to zero volts. During operation, the input to each of the keys is set to zero volts and VDD is turned on. The programmed keys then leak to provide a programmed output. The output node of the key remains low for those devices whose gate was previously not programmed, i.e. set to zero volts during irradiation. The key system can be useful for surreptitiously determining whether or a not a circuit has been irradiated above a specified value by using the output to set an internal flag, for example. In addition, an on-board "kill circuit" can be used to render a circuit inoperative once a specified value of radiation has been exceeded.

It is a main feature of the present invention that the harmful effects of total dose radiation on a silicon-based integrated memory circuit are harnessed to create a useful programming technique.

It is an advantage of the present invention that the programmed and irradiated memory circuits are radiation hardened and further radiation exposure (in a radiation environment such as outer space) only further establishes or enhances the programmed memory pattern.

The foregoing and other objects, features and advantages of the invention will become more readily apparent from the following detailed description of a preferred embodiment of the invention, which proceeds with reference to the accompanying drawings.

BRIEF DESCRIPTION OF THE DRAWINGS

FIG. 13 is a circuit diagram of a programmable key circuit according to any of the key circuits of FIGS. 10-12 and further including additional circuitry such as additional amplifiers or level-shifting circuitry or the like.

DETAILED DESCRIPTION

Figure 1:
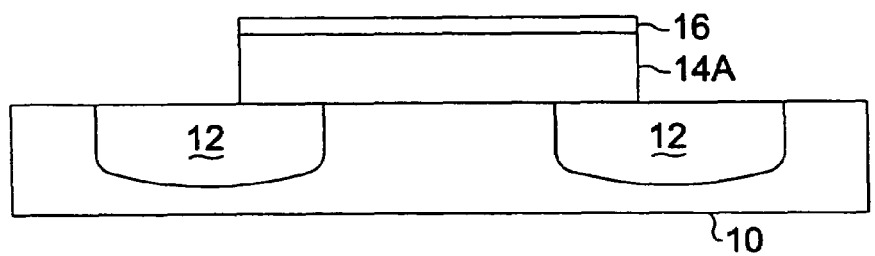
FIG. 1 is a cross-sectional diagram of a prior art N-channel transistor including a substrate, N-type source/drain diffusions, a silicon dioxide gate layer, and a polysilicon gate contact.
Figure 2:
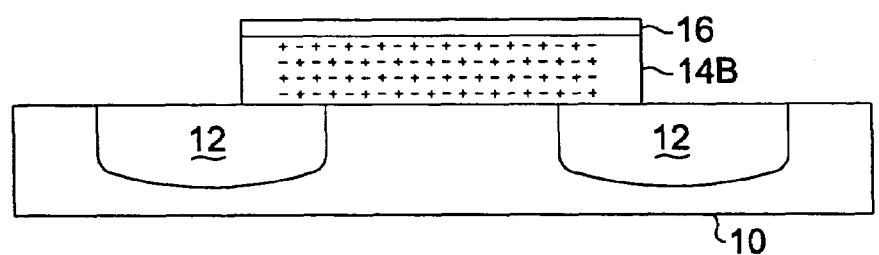
FIG. 2 is a cross-sectional diagram of the transistor of FIG. 1 immediately after being irradiated showing numerous electron-hole pairs in the silicon dioxide gate layer.
Figure 3:
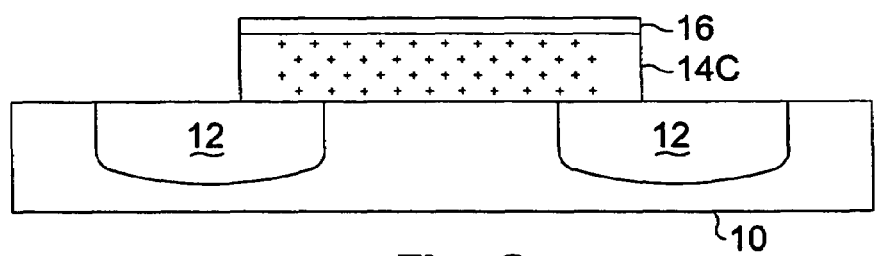
FIG. 3 is a cross-sectional diagram of the transistor of FIG. 2 after electron transport, leaving numerous holes trapped in the silicon dioxide gate layer.
Figure 4:
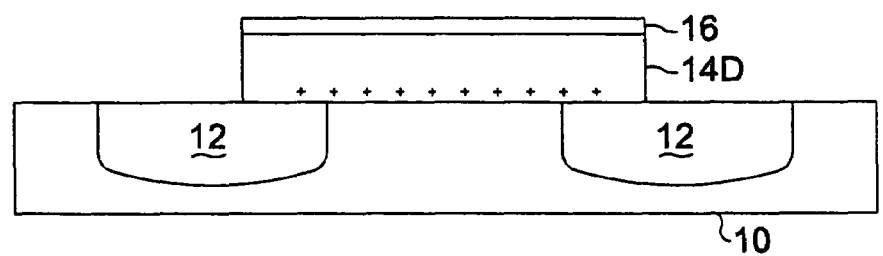
FIG. 4 is a cross-sectional diagram of the transistor of FIG. 3 showing the final trapped hole charges in the silicon dioxide gate layer.
Figure 5:
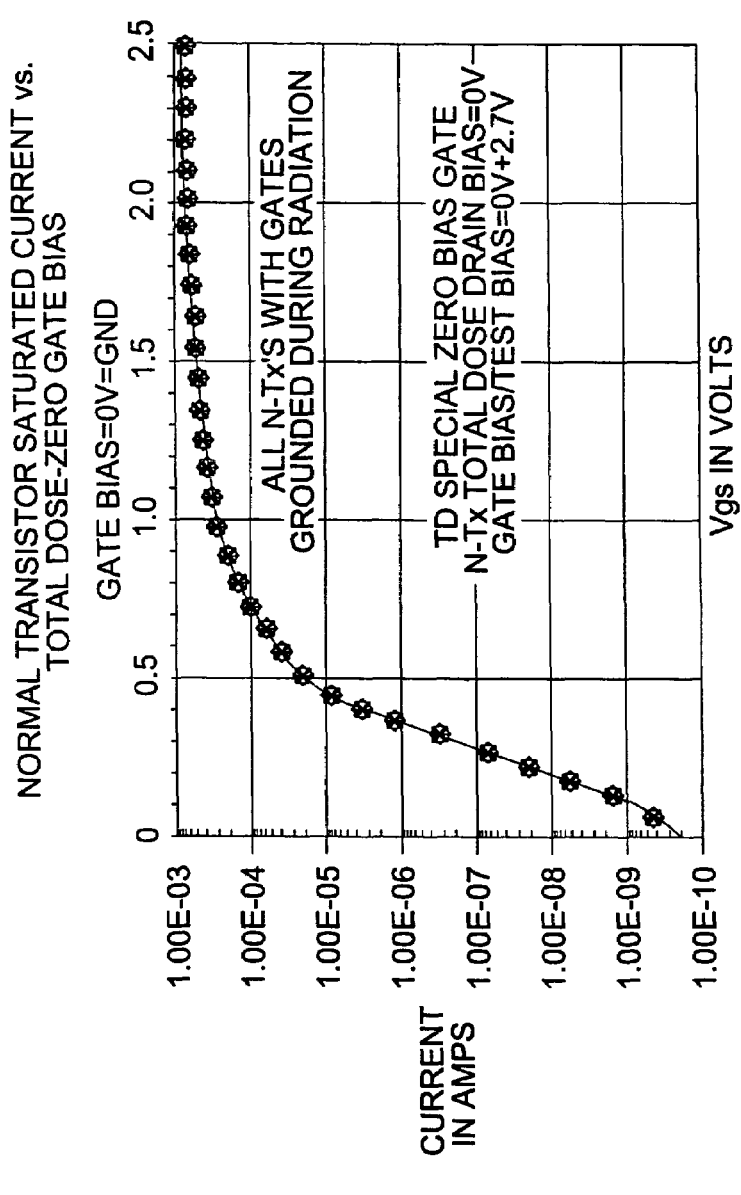
FIG. 5 is a plot of transistor current versus gate-to-source voltage for an N-channel transistor in which the gate voltage is set to zero volts in which the transistor is irradiated at five levels of total dose radiation from 0K RADs to 1 Meg RAD.
Figure 5:
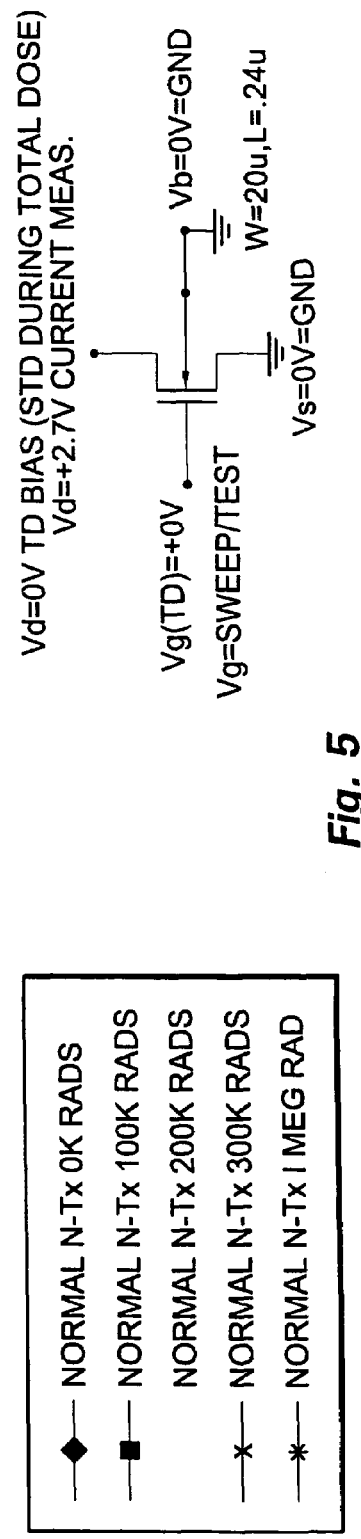

Referring now to FIG. 5 a plot of transistor current versus gate-to-source voltage for an N-channel transistor in which the gate voltage is set to zero volts in which the transistor is irradiated at five levels of total dose radiation from 0K RADs to 1 Meg RAD is shown. Note that for a gate voltage set to zero volts, the transistor current response is nearly identical for total dose irradiation at the zero, 100K, 200K, 300K, and 1 Meg RAD levels. The transistor exhibits a normal current response with current decreasing below VGS voltages of about 0.7 volts.

Figure 6:
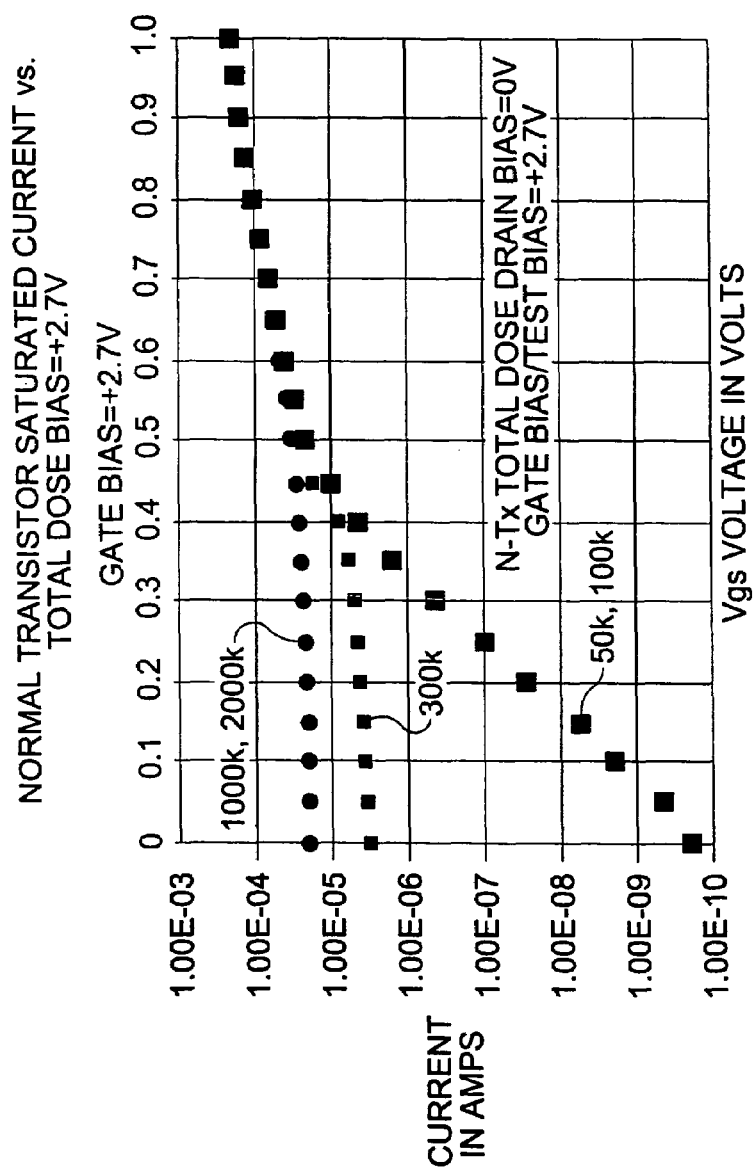
FIG. 6 is a plot of transistor current versus gate-to-source voltage from zero to one volt for an N-channel transistor in which the gate voltage is set to 2.7 volts in which the transistor is irradiated at five levels of total dose radiation from 50K RADs to 2 Meg RAD.
Figure 6:
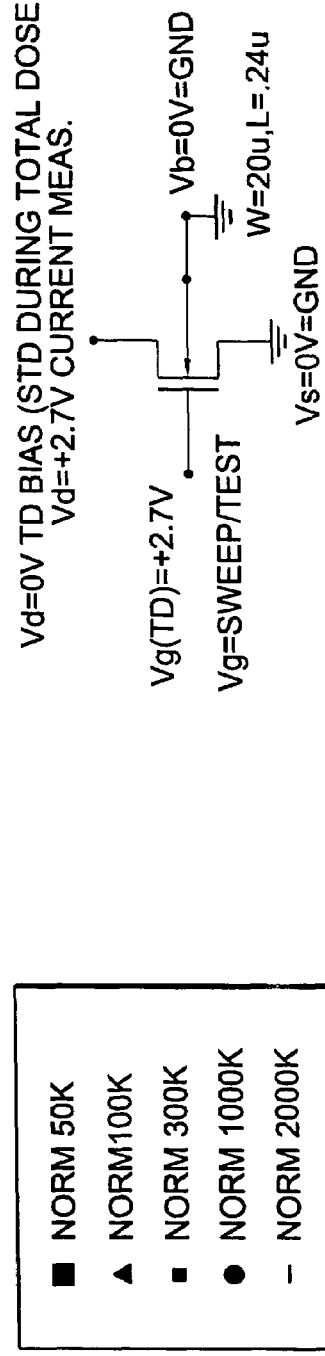
Figure 7:
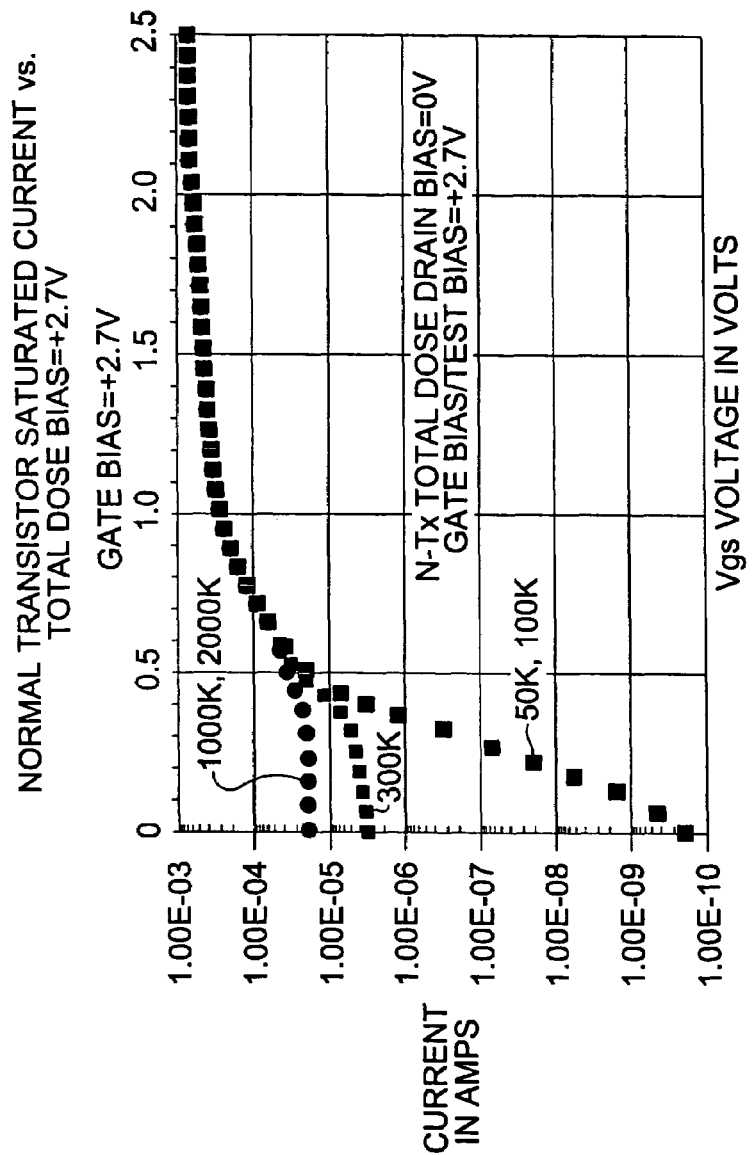
FIG. 7 is a plot of transistor current versus gate-to-source voltage from zero to 2.5 volts for an N-channel transistor in which the gate voltage is set to 2.7 volts in which the transistor is irradiated at five levels of total dose radiation from 50K RADs to 2 Meg RAD.
Figure 7:
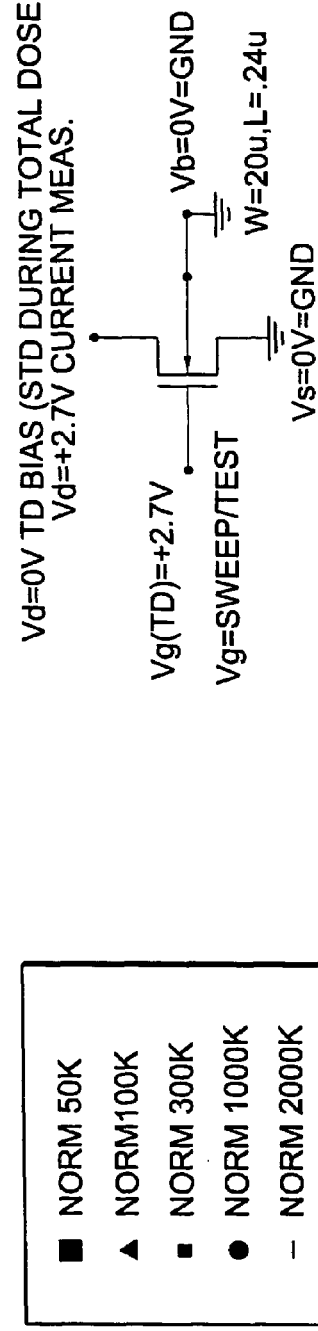

Referring now to FIG. 6 a plot of transistor current versus gate-to-source voltage from zero to one volts for an N-channel transistor in which the gate voltage is set to 2.7 volts in which the transistor is irradiated at five levels of total dose radiation from 50K RADs to 2 Meg RAD. Note that for a gate voltage set to zero volts, the transistor current response splits between a total dose of 100K RADs and 300K RADs. At dose irradiation levels of 100K RADs and below, transistor current response is similar to that of the transistor shown in FIG. 5. However, for total dose irradiation levels of 300K RADs and above, transistor current continues (current greater than 1 μA) to persist even though VGS voltages are dropped below 0.7 volts. Referring now to FIG. 7 a plot of transistor current versus gate-to-source voltage is expanded from zero to 2.5 volts is shown for the N-channel transistor of FIG. 6.

Figure 8:
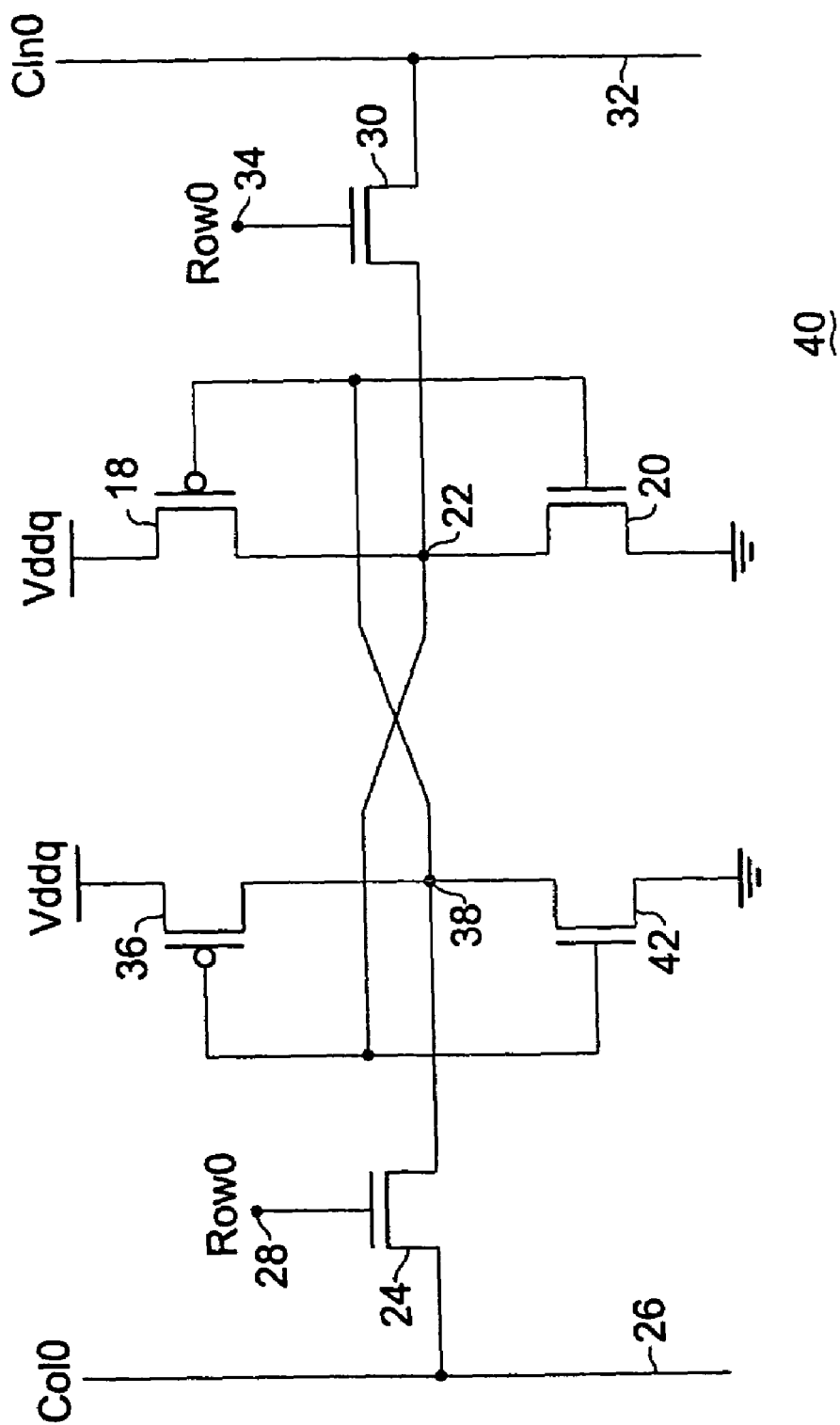
FIG. 8 is a plot of a typical SRAM cell suitable for use as a programmable memory cell according to the present invention.

Referring now to FIG. 8 a schematic diagram of an SRAM cell 40 having "soft" non-radiation hardened transistors suitable for use as a programmable memory cell according to the present invention is shown. SRAM memory cell 40 includes complementary column select or data lines 26 and 32, and row select nodes 28 and 34. The core of the SRAM cell includes cross-coupled P-channel transistors 36 and 18, and cross-coupled N-channel transistors 42 and 20. The current paths of transistors 36 and 42 are coupled together at node 38 and the current paths of transistors 18 and 20 are coupled together at node 22. N-channel pass transistors 24 and 30 transfer the complementary data state from circuit nodes 38 and 22 to column lines 26 and 32, respectively.

In operation, either of transistors 42 and 20 will have its gate biased at ground potential, and the other transistor will have its gate biased at VDD. The transistor having a gate biased to zero volts does not change during irradiation, but the other transistor having a gate biased at VDD experiences a voltage threshold shift. The voltage threshold shift causes the cross-coupled circuit shown in FIG. 8 to be permanently pre-disposed to a data state, effectively converting the normal "soft" SRAM cell into a radiation-hardened read-only memory cell (as long as the write line is kept off or low).

Figure 9:
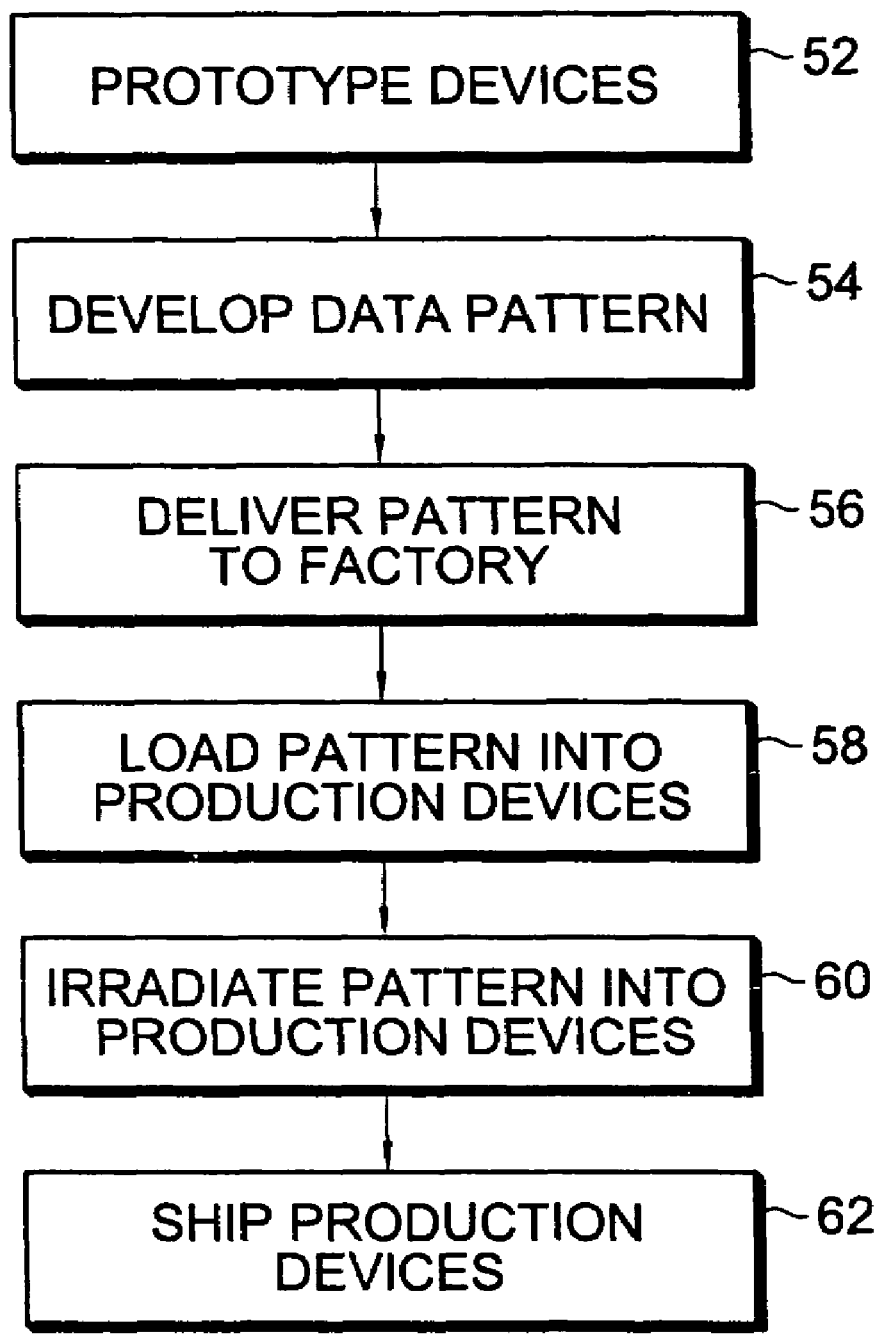
FIG. 9 is a block diagram flow chart of the method of the present invention.

Referring now to FIG. 9 a block diagram 50 of the method of the present invention is shown. At the first step 52 prototype soft memory devices are supplied to a customer. At step 54 the customer uses the prototype devices in his system to develop working data patterns in the field in the same manner as a reading and writing to a normal RAM memory device. The final debugged data pattern is saved into memory. At step 56 the customer delivers the data pattern to the factory so that it can be burned into equivalent commercial devices. At step 58 the customer-developed data pattern is loaded into memory at the factory, and the customer-developed data pattern is programmed into a number of production circuits. At step 60 the production circuits are irradiated at a typical total dosage of between 300K and 1 Meg RAD to burn the data pattern into memory as discussed above. At step 62 a pin-compatible irradiated and programmed parts are shipped to the customer.

Figure 10:
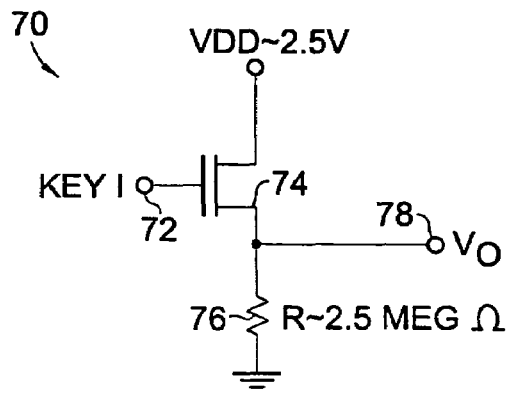
FIG. 10 is a circuit diagram of a programmable key circuit including an N-channel transistor and a resistor coupled together in a source-follower circuit configuration according to a second embodiment of the invention.

A second embodiment of the programmed and irradiated N-channel transistor of the present invention is shown in FIG. 10. A programmed key 70 is shown including an N-channel transistor 74 and resistor 76 coupled together in a source-follower amplifier configuration. The main current path of key 70 flows between the VDD power supply and ground. The gate of key 70 is coupled to the input terminal 72, designated KeyI. The junction of N-channel transistor 74 and resistor 76 forms the output node 78 labeled VO. The method of the present invention can be used to provide a series of programmed keys 70, one of which is shown in FIG. 10. During radiation, the input node of keys 70 are set high or low and VDD is set to zero volts. During operation, the input 72 to keys 70 are set to zero volts and VDD is turned on. The programmed keys leak to provide a programmed output at node 78. For example, if resistor 76 is set to 2.5 MegΩ, and the leakage current of N-channel is approximately one micro-amp, then the output node 78 should approach the power supply voltage of 2.5 volts (within a threshold voltage) for the previously programmed devices. The output node 78 remains low for those devices whose gate was previously not programmed, i.e. set to zero volts during irradiation. The key system shown in FIG. 10 can be useful for surreptitiously determining whether or not a circuit has been irradiated above a specified value by using the output at node 78 to set an internal flag, for example. In addition, an on-board "kill circuit" could be used to render a circuit inoperative once a specified value of radiation has been exceeded using the output voltage signal at node 78.

Figure 11:
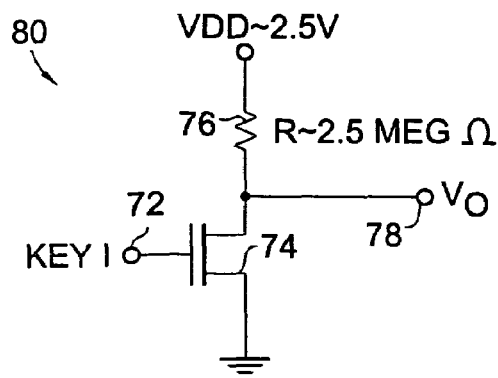
FIG. 11 is a circuit diagram of a programmable key circuit including an N-channel transistor and a resistor coupled together in a common-source amplifier configuration according to a second embodiment of the invention.
Figure 12:
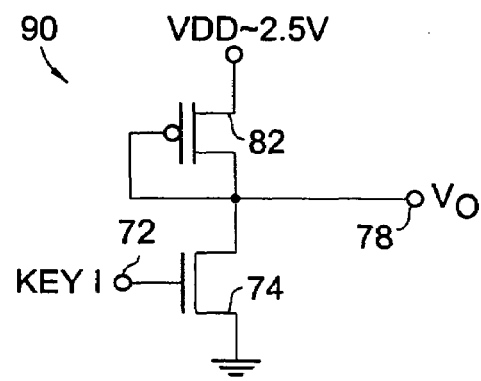
FIG. 12 is a circuit diagram of a programmable key circuit including an N-channel transistor and a P-channel transistor coupled together in a common-source amplifier configuration according to a second embodiment of the invention.
Figure 13:
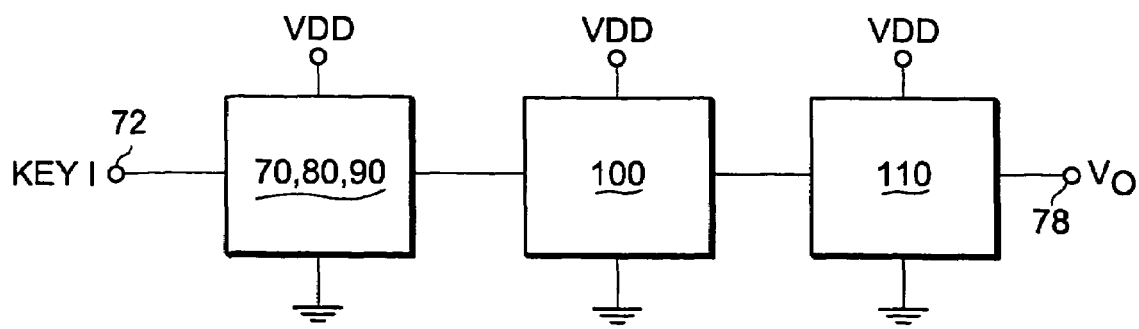

FIGS. 11-13 illustrate alternative configurations to the programmable key circuit 70 shown in FIG. 10 according to a second embodiment of the present invention, although the output signal polarity of the circuits is inverted from key circuit 70. FIG. 11 is a circuit diagram of a programmable key circuit 80 including an N-channel transistor 74 and a resistor 76 coupled together in a common-source amplifier configuration. FIG. 12 is a circuit diagram of a programmable key circuit 90 including an N-channel transistor 72 and a P-channel transistor 82 coupled together in a common-source amplifier configuration. FIG. 13 is a circuit diagram of a programmable key circuit using any of the programmable key circuits 70, 80, or 90 and further including additional circuitry such as additional amplifiers 100 or level-shifting circuitry 110 or the like.

Having described and illustrated the principle of the invention in a preferred embodiment thereof, it is appreciated by those having skill in the art that the invention can be modified in arrangement and detail without departing from such principles. For example, while a typical effective dosage range of between 300K and 1 Meg RAD is suggested for proper operation of the invention, the exact dosage range can be adjusted as required for a particular application or semiconductor process as long as the programmed corresponding leakage current is about one micro-amp. We therefore claim all modifications and variations coming within the spirit and scope of the following claims.

We claim:

1. A radiation-hardened SRAM memory cell comprising:
   complementary column select lines;
   a row select line;
   cross-coupled first and second P-channel transistors;
   cross-coupled first and second N-channel transistors, the current paths of the first P-channel and first N-channel transistors being coupled together at a first node and the current paths of the second P-channel and second N-channel transistors being coupled together at a second node;
   a pair of pass transistors for transferring a complementary data state from the first and second nodes to the complementary column select lines,
   wherein a gate of the first N-channel transistor is biased to ground and the gate of the second N-channel transistor is biased to VDD, the first and second N-channel transistors being irradiated to a sufficient dosage to establish a permanent data state in the memory cell.

2. A radiation-hardened memory cell as in claim 1 in which each of the pair of pass transistors comprise N-channel transistors.

3. A radiation-hardened memory cell as in claim 1 in which the first and second N-channel transistors have been exposed to a total dose or radiation between 300K and 1 MEG RADs.

4. A radiation-hardened SRAM memory cell comprising:
   first and second nodes;
   first and second transistors having current paths coupled at the first node, and gates coupled to the second node;
   third and fourth transistors having current paths connected at the second node, and gates coupled to the first node, wherein
   the second and fourth transistors being irradiated with a sufficient dosage to induce a permanent complimentary data state at the first and second nodes.

5. The memory cell of claim 4 in which the second and fourth transistors each comprise N-channel transistors.

6. The memory cell of claim 4 in which the first and third transistors each comprise P-channel transistors.

7. The memory cell of claim 4 in which the gate of the second transistor is set to a logic one voltage and the gate of the fourth transistor is set to a logic zero voltage prior to irradiation.

8. The memory cell of claim 7 in which the logic one voltage is about 2.7 volts and the logic zero voltage is about zero volts.

9. The memory cell of claim 4 further comprising:
   a pair of complementary column select lines;
   means for coupling the complementary column select lines to the first and second nodes; and
   a row select line coupled to the coupling means.

10. The memory cell of claim 9 in which the coupling means comprises first and second pass transistors.

11. The memory cell of claim 10 in which the first pass transistor comprises an N-channel transistor having a gate coupled to the row select line.

12. The memory cell of claim 10 in which the second pass transistor comprises an N-channel transistor having a gate coupled to the row select line.

* * * * *